United States Patent
Hasan et al.

(10) Patent No.: US 11,669,020 B2
(45) Date of Patent: Jun. 6, 2023

(54) METHOD AND APPARATUS FOR PATTERN FIDELITY CONTROL

(71) Applicant: ASML NETHERLANDS B.V., Veldhoven (NL)

(72) Inventors: Tanbir Hasan, San Jose, CA (US); Vivek Kumar Jain, Fremont, CA (US); Stefan Hunsche, Santa Clara, CA (US); Bruno La Fontaine, Pleasanton, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 132 days.

(21) Appl. No.: 17/162,017

(22) Filed: Jan. 29, 2021

(65) Prior Publication Data

US 2021/0181642 A1    Jun. 17, 2021

Related U.S. Application Data

(63) Continuation of application No. 16/468,063, filed as application No. PCT/EP2017/080704 on Nov. 28, 2017, now Pat. No. 10,908,515.

(60) Provisional application No. 62/438,665, filed on Dec. 23, 2016.

(51) Int. Cl.
*G03F 7/20* (2006.01)
*G03F 9/00* (2006.01)

(52) U.S. Cl.
CPC .......... *G03F 7/70641* (2013.01); *G03F 7/705* (2013.01); *G03F 7/7065* (2013.01); *G03F 7/70508* (2013.01); *G03F 7/70541* (2013.01); *G03F 9/7026* (2013.01)

(58) Field of Classification Search
CPC .. G03F 7/70508; G03F 7/70541; G03F 7/705; G03F 7/70775; G03F 9/7026; G03F 7/70608–70683; H01L 21/027
USPC ............... 355/30, 52–55, 67–77; 716/50–54; 250/492.1, 492.2, 492.22, 492.23, 493.1, 250/505.1
See application file for complete search history.

(56) References Cited

U.S. PATENT DOCUMENTS

| 5,448,332 | A  | 9/1995 | Sakakibara et al. |
| 5,969,441 | A  | 10/1999 | Loopstra et al. |
| 7,587,704 | B2 | 9/2009 | Ye et al. |

(Continued)

FOREIGN PATENT DOCUMENTS

WO    2018019496    2/2018

OTHER PUBLICATIONS

International Search Report and Written Opinion issued in corresponding PCT Patent Application No. PCT/EP2017/080704, dated Jul. 3, 2018.

(Continued)

*Primary Examiner* — Christina A Riddle
(74) *Attorney, Agent, or Firm* — Pillsbury Winthrop Shaw Pittman, LLP

(57) ABSTRACT

A method of topography determination, the method including: obtaining a first focus value derived from a computational lithography model modeling patterning of an unpatterned substrate or derived from measurements of a patterned layer on an unpatterned substrate; obtaining a second focus value derived from measurement of a substrate having a topography; and determining a value of the topography from the first and second focus values.

20 Claims, 9 Drawing Sheets

(56) References Cited

U.S. PATENT DOCUMENTS

| | | |
|---|---|---|
| 2004/0130691 A1* | 7/2004 | Boonman ............. G03F 9/7026 355/53 |
| 2004/0239905 A1 | 12/2004 | Van Rhee et al. |
| 2006/0234136 A1* | 10/2006 | Kim ..................... G03F 1/44 430/5 |
| 2006/0273266 A1 | 12/2006 | Preil et al. |
| 2007/0266362 A1 | 11/2007 | Lai et al. |
| 2008/0131796 A1* | 6/2008 | Werner .................. H01L 22/12 430/30 |
| 2008/0286885 A1* | 11/2008 | Izikson ............... G03F 7/70625 438/7 |
| 2009/0000950 A1* | 1/2009 | Ortleb ................... H01L 22/12 204/298.03 |
| 2009/0157360 A1 | 6/2009 | Ye et al. |
| 2009/0262320 A1* | 10/2009 | Staals .................. G03F 9/7003 355/55 |
| 2011/0205515 A1 | 8/2011 | Menchtchikov et al. |
| 2012/0194792 A1 | 8/2012 | Sapp et al. |
| 2013/0065328 A1 | 3/2013 | Wang et al. |
| 2013/0176558 A1 | 7/2013 | Lin et al. |
| 2013/0215404 A1 | 8/2013 | Den Boef et al. |
| 2014/0282300 A1 | 9/2014 | Katakamsetty |
| 2015/0015870 A1 | 1/2015 | Lin et al. |
| 2015/0227654 A1 | 8/2015 | Hunsche |
| 2015/0298282 A1* | 10/2015 | Vukkadala ............ B24B 37/005 451/8 |
| 2016/0154922 A1 | 6/2016 | Kuncha et al. |
| 2016/0162626 A1 | 6/2016 | Hermann |
| 2016/0313647 A1* | 10/2016 | Halder ..................... G03F 1/84 |
| 2017/0160648 A1* | 6/2017 | Tel ..................... G03F 7/70516 |
| 2019/0318935 A1* | 10/2019 | Lallement ............... G06F 30/20 |

OTHER PUBLICATIONS

Taiwanese Office Action issued in corresponding Taiwanese Patent Application No. 106144315, dated Sep. 12, 2018.

J-G. Simiz, et al.: "Predictability and impact of product layout induced topology on across-field focus control", Proc. of SPIE, vol. 9424, Mar. 19, 2015.

J.G. Simiz, et al.: "Product layout induced topography effects on intrafield levelling", Proc. SPIE, vol. 9661, Sep. 4, 2015.

J-G. Simiz, et al.: "Verification and application of multi-source focus quantification", Proc. of SPIE, vol. 9781, Mar. 16, 2016.

* cited by examiner

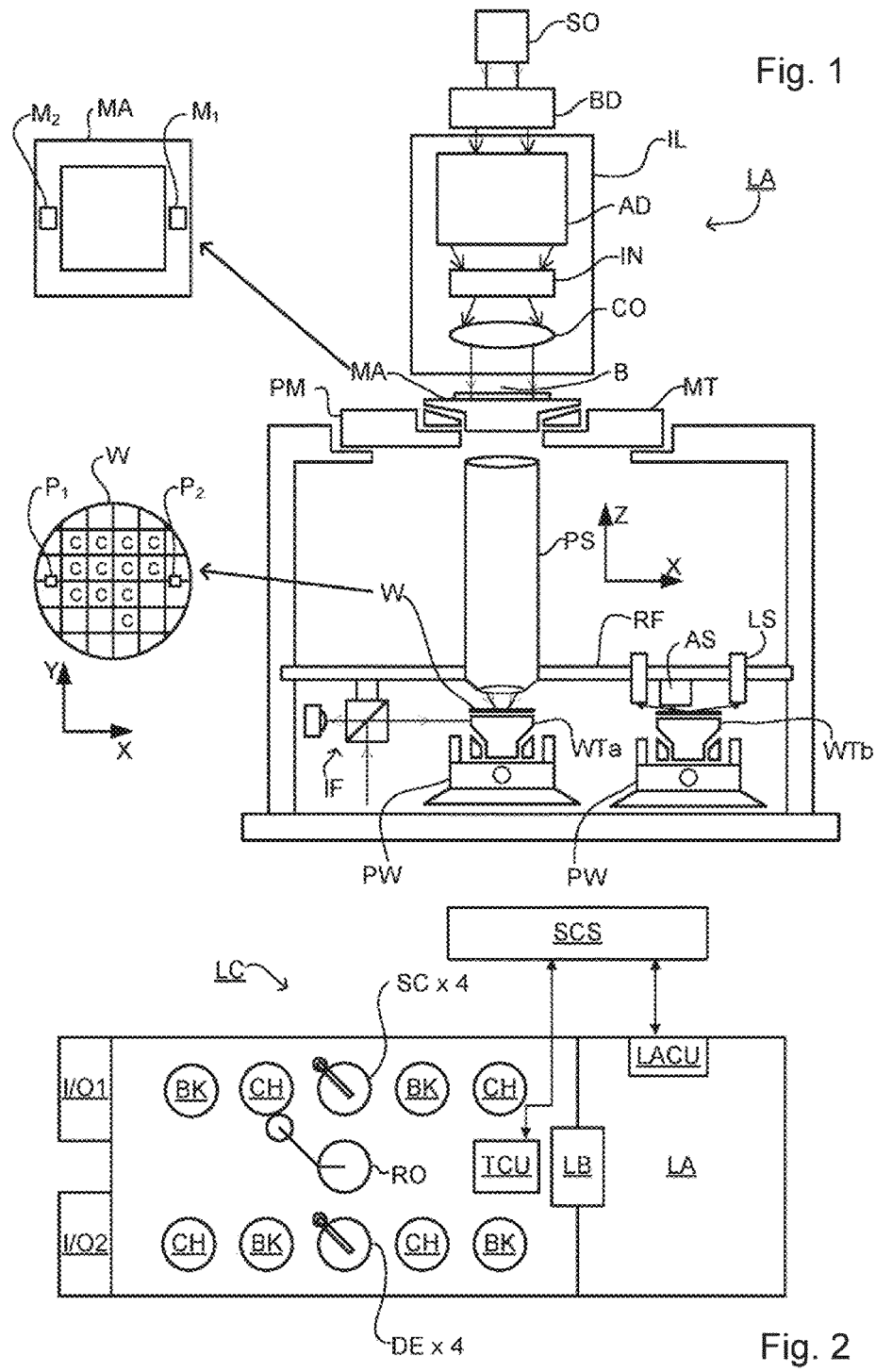

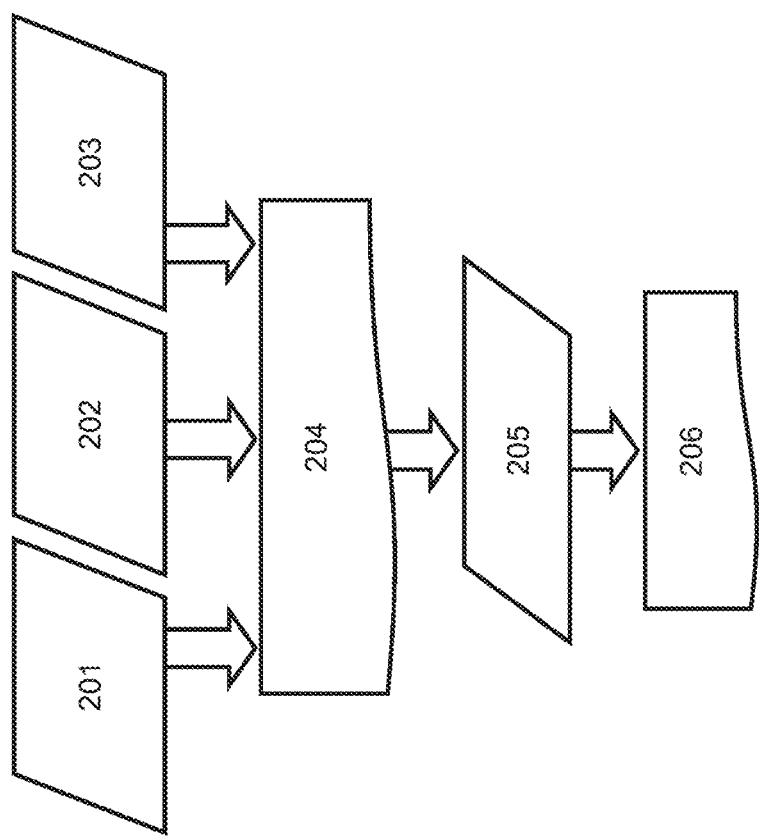

METHOD AND APPARATUS FOR PATTERN FIDELITY CONTROL

This application is a continuation of U.S. patent application Ser. No. 16/468,063, filed Jun. 10, 2019, which is the U.S. national phase entry of PCT patent application no. PCT/EP2017/080704, which was filed on Nov. 28, 2017, which claims the benefit of priority of U.S. provisional patent application No. 62/438,665, which was filed on Dec. 23, 2016, each of the foregoing applications is incorporated herein in its entirety by reference.

FIELD

The description herein relates to a method, and an apparatus applying the method, of determining product induced topography by combining computational lithography modeling and on-product measurement. The description herein also relates to a method and apparatus to identify and rank hotspots.

BACKGROUND

A lithography apparatus can be used, for example, in the manufacture of integrated circuits (ICs). In such a case, a patterning device (e.g., a mask) may contain or provide a device pattern corresponding to an individual layer of the IC ("design layout"), and this pattern can be transferred onto a target portion (e.g. comprising one or more dies) on a substrate (e.g., silicon wafer) that has been coated with a layer of radiation-sensitive material ("resist"), by methods such as irradiating the target portion through the pattern of the patterning device. In general, a single substrate contains a plurality of adjacent target portions to which the pattern is transferred successively by the lithography apparatus, one target portion at a time. In one type of lithography apparatuses, the pattern of the entire patterning device is transferred onto one target portion in one go; such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the pattern of the patterning device are transferred to one target portion progressively. Since, in general, the lithography apparatus will have a magnification factor M (generally <1), the speed F at which the substrate is moved will be a factor M times that at which the projection beam scans the patterning device.

Prior to transferring the pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern of the patterning device to a substrate and typically, but optionally, involves one or more related pattern processing steps, such as resist development by a development apparatus, baking of the substrate using a bake tool, etching using the pattern using an etch apparatus, etc.

SUMMARY

A product substrate usually contains pattern density induced topography at very small (sub-mm) resolution; the magnitude of this topography is often in the nanometers. But, the magnitude can be significant compared to process focus margins. A conventional level sensor equipped within a lithography apparatus may not measure this product topography of the substrate at sub-millimeter lateral resolution. In addition, the physical limitation of the exposure slit size and shape makes this topography very difficult to correct by a lithographic apparatus focus control system using the level sensor data.

Accordingly, it is desirable to, e.g., be able to effectively measure such topography and identifying which pattern features are prone to be defective due at least in part to the topography.

In an embodiment, there is provided a method of topography determination, the method comprising: obtaining a first focus value derived from a computational lithography model modeling patterning of an unpatterned substrate or derived from measurements of a patterned layer on an unpatterned substrate; obtaining a second focus value derived from measurement of a substrate having a topography; and determining a value of the topography from the first and second focus values.

In an embodiment, there is provided a method of hotspot evaluation, the method comprising: obtaining process window data for each of a first hotpot and a second hotspot, the process window data comprising focus information for each of the first and second hotspot; and evaluating, by a hardware computer, the focus information of the process window data based on topography data of a substrate, to identify or change a criticality of the first and/or second hotspot.

In an embodiment, there is provided a computer program product comprising a computer non-transitory readable medium having instructions recorded thereon, the instructions when executed by a computer implementing any one of the above methods.

BRIEF DESCRIPTION OF THE DRAWINGS

FIG. 1 illustrates a schematic diagram of a lithography apparatus;

FIG. 2 depicts an embodiment of a lithographic cell or cluster;

FIG. 3 illustrates a block diagram of simulation models corresponding to subsystems in FIG. 1;

DETAILED DESCRIPTION OF THE DRAWINGS

Figure 4A:
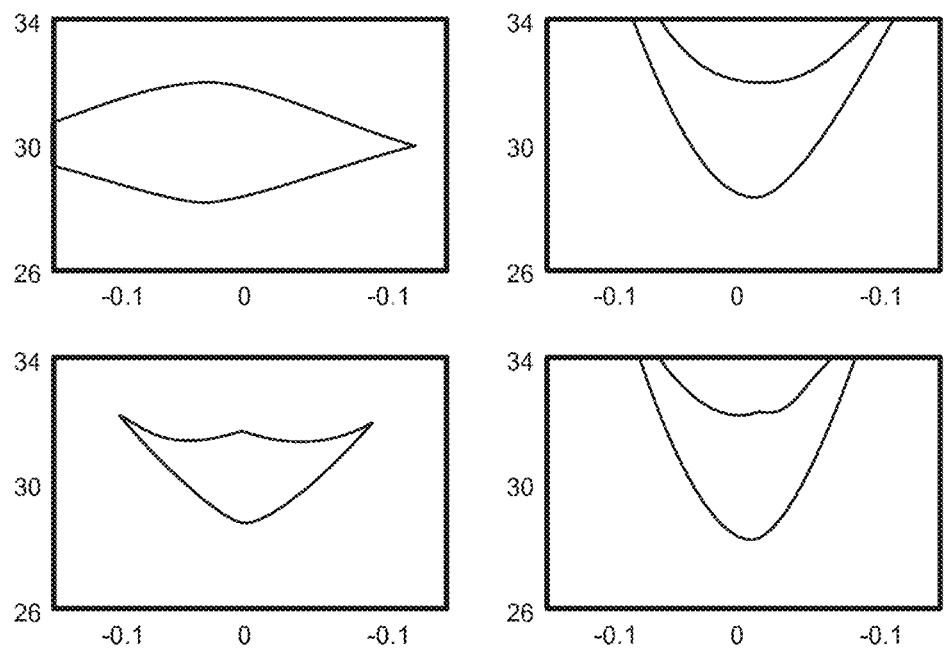
FIG. 4A illustrates sub-process windows spanned by focus (horizontal axis) and dose (vertical axis), for CD (CD-PWs) of each of four patterns.

FIG. 1 schematically depicts a lithographic apparatus LA in association with which the techniques described herein can be utilized. The apparatus includes an illumination optical system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; one or more substrate tables (e.g., a wafer table) WTa, WTb constructed to hold a substrate (e.g., a resist coated wafer) W and connected to a second positioner PW configured to accurately position the substrate in accordance with certain parameters; and a projection optical system (e.g., a a refractive, catoptric or catadioptric optical system) PS configured to project a pattern imparted to the radiation beam B by patterning device MA onto a target portion C (e.g., including one or more dies) of the substrate W.

The illumination optical system may include various types of optical components, such as refractive, reflective, magnetic, electromagnetic, electrostatic or other types of optical components, or any combination thereof, for directing, shaping, or controlling radiation. In this particular case, the illumination system also comprises a radiation source SO.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

As here depicted, the apparatus is of a transmissive type (e.g., employing a transmissive patterning device). However, the apparatus may be of a reflective type (e.g., employing a programmable mirror array of a type as referred to above, or employing a reflective mask). The apparatus may employ a different kind of patterning device to classic mask; examples include a programmable mirror array or LCD matrix.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO (e.g., a mercury lamp or excimer laser, LPP (laser produced plasma) EUV source). The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the spatial and/or angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table) MT, and is patterned by the patterning device. Having traversed the patterning device (e.g., mask) MA, the radiation beam B passes through the projection optical system PS, which focuses the beam onto a target portion C of the substrate W, thereby projecting an image of the pattern on the target portion C. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using patterning device alignment marks $M_1$, $M_2$ and substrate alignment marks $P_1$, $P_2$. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the patterning device alignment marks may be located between the dies. Small alignment markers may also be included within dies, in amongst the device features, in which case it is desirable that the markers be as small as possible and not require any different imaging or process conditions than adjacent features. The alignment system, which detects the alignment markers, is described further below.

Lithographic apparatus LA in this example is of a so-called dual stage type which has two substrate tables WTa, WTb and two stations—an exposure station and a measurement station—between which the substrate tables can be exchanged. While one substrate on one substrate table is being exposed at the exposure station, another substrate can be loaded onto the other substrate table at the measurement station and various preparatory steps carried out. The preparatory steps may include mapping the surface control of the substrate using a level sensor LS, measuring the position of alignment markers on the substrate using an alignment sensor AS, performing any other type of metrology or inspection, etc. This enables a substantial increase in the throughput of the apparatus. More generally, the lithography apparatus may be of a type having two or more tables (e.g., two or more substrate tables, a substrate table and a measurement table, two or more patterning device tables, etc.). In such "multiple stage" devices a plurality of the multiple tables may be used in parallel, or preparatory steps may be carried out on one or more tables while one or more other tables are being used for exposures. Twin stage lithography apparatuses are described, for example, in U.S. Pat. No. 5,969,441, incorporated herein by reference in its entirety.

While a level sensor LS and an alignment sensor AS are shown adjacent substrate table WTb, it will be appreciated that, additionally or alternatively, a level sensor LS and an alignment sensor AS can be provided adjacent the projection system PS to measure in relation to substrate table WTa.

The depicted apparatus can be used in a variety of modes, including for example a step mode or a scan mode. The construction and operation of lithographic apparatus is well known to those skilled in the art and need not be described further for an understanding of the embodiments of the present invention.

As shown in FIG. 2, the lithographic apparatus LA forms part of a lithographic system, referred to as a lithographic cell LC or a lithocell or cluster. The lithographic cell LC may also include apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

The patterning device referred to above comprises, or can form, one or more design layouts or patterns (hereinafter design pattern for convenience). The design pattern can be generated utilizing CAD (computer-aided design) programs, this process often being referred to as EDA (electronic design automation). Most CAD programs follow a set of predetermined design rules in order to create functional design patterns/patterning devices. These rules are set by processing and design limitations. For example, design rules define the space tolerance between circuit devices (such as gates, capacitors, etc.) or interconnect lines, so as to ensure that the circuit devices or lines do not interact with one another in an undesirable way. One or more of the design rule limitations may be referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the substrate (via the patterning device).

So, in a lithography apparatus, an illumination system provides illumination (i.e. radiation) in the form of an illumination mode to a patterning device and the projection system directs and shapes the illumination, via the patterning device, onto a substrate via aerial image (AI). The illumination mode defines the characteristics of the illumination, such as the angular or spatial intensity distribution (e.g., conventional, dipole, annular, quadrupole, etc.), an illumination sigma ($\alpha$) setting, etc. The aerial image (AI) is the radiation intensity distribution at substrate level. A resist layer on the substrate is exposed and the aerial image is transferred to the resist layer as a latent "resist image" (RI) therein. The resist image (RI) can be defined as a spatial distribution of solubility of the resist in the resist layer.

Now, to enable patterning process design, control, monitoring, etc., one or more parts of the patterning process can be mathematically modelled and/or simulated. For example, the lithographic process can be simulated/modeled to analyzing how an input design pattern layout is imaged by a lithographic apparatus under specific conditions. Thus, a simulation will typically be performed that mathematically models the imaging by a lithography apparatus.

An exemplary flow chart for simulating lithography in a lithography apparatus is illustrated in FIG. 3. An illumination model 301 represents optical characteristics (including radiation intensity distribution and/or phase distribution) of the illumination provided to the patterning device. A projection system model 302 represents optical characteristics (including changes to the radiation intensity distribution and/or the phase distribution caused by the projection system) of the projection system. A design pattern model 303 represents optical characteristics (including changes to the radiation intensity distribution and/or the phase distribution caused by a given design pattern layout 303) of a design pattern layout, which is the representation of an arrangement of features on or formed by a patterning device. An aerial image 304 can be simulated from the design pattern model 303, the projection system model 302 and the design pattern model 303. A resist image 306 can be simulated from the aerial image 304 using a resist model 305. Simulation of lithography can, for example, predict contours and CDs in the resist image.

More specifically, it is noted that the illumination model 301 can represent the optical characteristics of the illumination mode and/or illumination system that include, but not limited to, a numerical aperture setting, an illumination sigma ($\sigma$) setting, a particular illumination shape (e.g. off-axis radiation illumination such as annular, quadrupole, dipole, etc.), etc. The projection system model 302 can represent the optical characteristics of the projection system, including aberration, distortion, one or more refractive indexes, one or more physical sizes, one or more physical dimensions, etc. The design pattern model 303 can represent one or more physical properties of a physical patterning device, as described, for example, in U.S. Pat. No. 7,587,704, which is incorporated by reference in its entirety. The resist model can be used to calculate the resist image from the aerial image, an example of which can be found in U.S. Patent Application Publication No. US 2009-0157360, the disclosure of which is hereby incorporated by reference in its entirety. The resist model is related only to properties of the resist layer (e.g., effects of chemical processes which occur during exposure, PEB and development). Optical properties of the lithography apparatus (e.g., properties of the illumination mode, the patterning device and the projection system) dictate the aerial image. Since the patterning device used in the lithography apparatus can be changed, it may be desirable to separate the optical properties of the patterning device from the optical properties of the rest of the lithography apparatus including at least the illumination system and the projection system.

So, an objective of the simulation is to accurately predict, for example, edge placement, aerial image intensity slope, and/or CD, which can then be compared against an intended design. This prediction can be performed for various conditions, such as various dose, focus, etc. conditions. The intended design is generally defined as a pre-optical proximity correction (OPC) design pattern which can be provided in a standardized digital file format such as GDSII or OASIS or other file format.

One or more portions of the design layout may be identified, which are referred to as clips, critical features or hotspots (hereinafter hotspots for convenience). In an embodiment, a set of hotspots is extracted, from the design layout and which represents the complicated patterns in the design layout (e.g., about 50 to 1000 hotspots can be provided by a user, although any number of hotspots may be provided, identified or used). These hotspots represent small portions (i.e. circuits, cells, patterns or design clips) of the design and especially represent small portions for which particular attention and/or verification is needed. The hotspots may be identified by experience (including hotspots provided by a user), by trial and error, or by running a full-chip simulation. In an embodiment, the imaging properties of hotspots define boundaries of a process window (e.g., a dose and focus process window within which exposed features have a critical dimension value within a tolerance range (e.g., ±5%, ±10)) for a patterning process. The hotspots may contain one or more test patterns or gauge patterns for use in their evaluation.

An initial larger set of hotspots may be provided a priori by a user based on one or more known critical feature areas in a design pattern which require particular attention. Or, in an embodiment, an initial larger set of hotspots may be extracted from the entire design pattern by using some kind of automated (such as machine vision) or manual algorithm that identifies the one or more critical feature areas.

The simulation may be directed to evaluating the process windows of some of the patterns in the design pattern. The process window of a pattern is a space of the processing parameters under which the pattern will be produced within specifications. From a mathematical point of view, a process window is a region in a vector space spanned by all the processing parameters. In a given patterning process, the process window of a pattern is dictated by the specifications of the pattern and the physics involved in the patterning process.

Using a region in a vector space spanned by all the processing parameters as the process window may not be convenient. A region of a subspace (i.e., a space spanned by fewer than all the processing parameters) ("sub-PW") may be used instead of the region the space spanned by all the processing parameters ("full PW"). For example, in a patterning process with many processing parameters, a region of the subspace spanned by focus and dose may be used as a sub-PW.

Processing parameters are parameters of the patterning process. The patterning process may include processes upstream and downstream to the actual lithographic transfer of the pattern. Processing parameters may belong to a number of categories. A first category may be parameters of the lithography apparatus or any other apparatuses used in the patterning process. Examples of this category include parameters of the illumination system, projection system, substrate stage, etc. of a lithography apparatus. A second category may be parameters of any procedures performed in the patterning process. Examples of this category include focus, dose, bandwidth, exposure duration, development temperature, chemical compositions used in development, etc. A third category may be parameters of the design pattern. Examples of this category may include resolution enhancement technique (RET) or optical proximity correction adjustments such as shapes and/or locations of assist features. A fourth category may be parameters of the substrate. Examples include characteristics of structures under a resist layer, chemical composition of the resist layer, and/or physical dimensions of the resist layer. A fifth category may be parameters that represent a characteristic of temporal variation of one or more parameters of the patterning process. Examples of this category may include a characteristic of high frequency stage movements (e.g., frequency, amplitude, etc.), a high frequency laser bandwidth change (e.g., frequency, amplitude, etc.) and/or a high frequency laser wavelength change. These high frequency changes or movements are those above the response time of a mechanism to adjust the underlying parameter (e.g., stage position, laser intensity, etc.). A sixth category may be a characteristic upstream or downstream to exposure, such as post-exposure bake (PEB), development, etching, deposition, resist application, doping and/or packaging.

Various patterns in the design pattern may have different process windows. Examples of pattern specifications that relate to potential systematic defects include checks for CD, necking, line pull back, line thinning, edge placement, overlapping, resist top loss, resist undercut and/or bridging. The process window of all the patterns in the design pattern or a portion thereof may be obtained by merging (e.g., overlapping) process windows of each individual pattern.

Figure 4B:
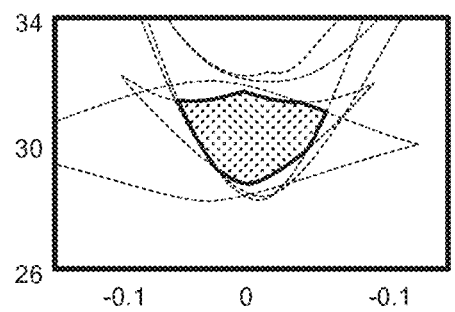
FIG. 4B illustrates a sub-process window (represented by the dot-hatched area), spanned by focus (horizontal axis) and dose (vertical axis), of CD (CD-OPW) of the four patterns.

In an example, when the specification of a pattern only dictates the CD of the pattern, the process window of the pattern may be called a CD process window (CD-PW). When the specification of a pattern only dictates the CDs of a group of patterns, the overlapping process window of the group of patterns may be called a CD overlapping process window (CD-OPW). A CD-PW or CD-OPW may have sub-PWs. FIG. 4A shows sub-PWs, spanned by focus (horizontal axis) and dose (vertical axis), of CD (CD-PWs) of each of four patterns. FIG. 4B shows a sub-PW (represented by the dot-hatched area), spanned by focus (horizontal axis) and dose (vertical axis), of CD (CD-OPW) of the four patterns. Thus, the CD-OPW is the overlapping area of the CD-PWs of the four patterns.

As noted above, those process windows of patterns that define the boundary of the overlapping process window can be considered as hotspots since those patterns are likely be defective if one or more of the process window processing parameters deviate relatively slightly from the respective process window definitions of those patterns. Accordingly, it useful to focus consideration on hotspots, by for example identifying them, reducing their number under consideration, and/or ranking their potential to be a defect in a patterning process subject to process variation.

Now, in a typical processing of a substrate, one or more overlaying layers of device structures are formed on a substrate. So, in an embodiment, a first layer can be formed by patterning a resist, which is then used as a mask for etching of layer. Then, one or more materials may be deposited thereon. For example, one or more filling materials may be provided to "fill" up any remaining recess. Thereafter, prior to application of a further layer of resist to pattern a next layer, a planarization process (e.g., chemical mechanical polishing (CMP)) may be performed to smooth the layer of the substrate for application of the resist layer. The smoothing is provided so that the subsequent resist layer is desirably smooth.

However, a topography can exist in a layer of the substrate underlying the resist layer, whether there has been a planarization process of that layer or not. The topography can be introduced by local pattern density variations over multiple layers on the substrate, even where a planarization process has been used on one or more of these layers. Therefore, the combined effect of pattern density and/or planarization on layers 0 to N−1 therefore form the topography that is encountered during the exposure of layer N.

Thus, the topography can induce, in particular, an intra-die or field effect since it arises from pattern density variations at the die or field level (hereinafter the discussion will focus on the die level but the same considerations apply at the field level—in an embodiment, a die corresponds to a portion of an object that becomes an individual device. That is, where the object is a semiconductor wafer, the object is cut into pieces corresponding to the dies, each die becoming, e.g., a semiconductor device; while, in an embodiment, a field corresponds to the size of the exposure field of a lithographic apparatus used to pattern a substrate and so a field may comprise a plurality of dies, where, e.g., the patterning device provides a pattern comprising a plurality of dies). This topography effect is distinct from an inter-die variation across the substrate (e.g., arising from substrate warping, etc.). Moreover, this intra-die topography effect is highly systematic, relatively predictable, and on a spatial frequency of the one or more functional blocks of device design. This is because essentially the same combination of pattern density variations occurs in each die across a substrate for a particular patterning process to manufacture a particular device on substrates.

Figure 5:
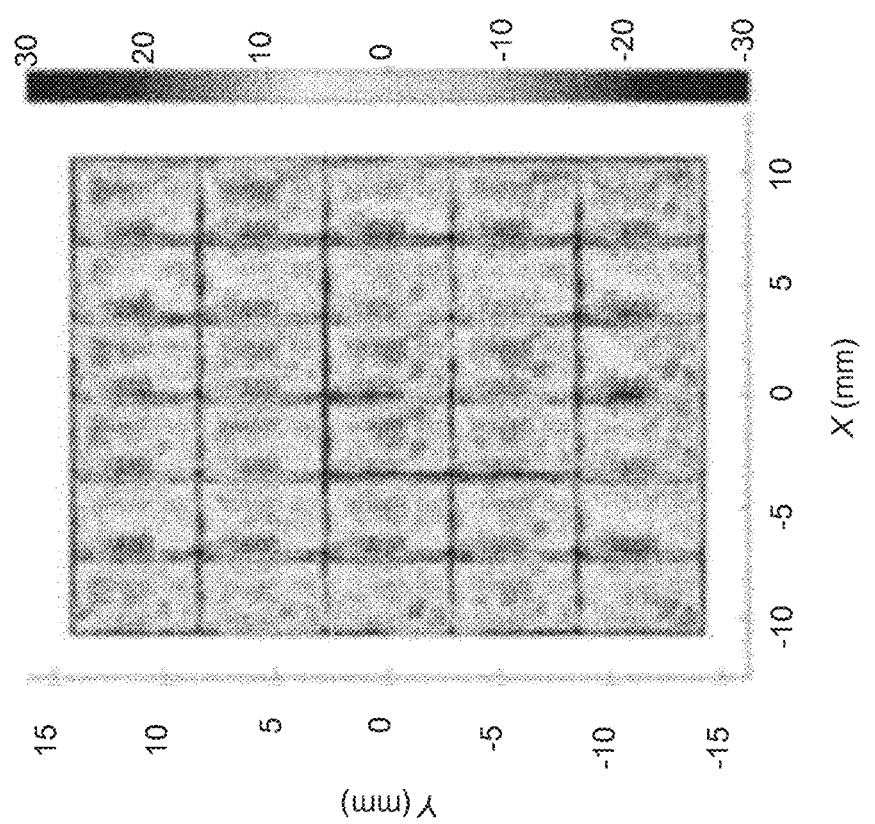
FIG. 5 illustrates a schematic example measured micron-resolution topography.

FIG. 5 shows a schematic example of the sub-millimeter (often sub-micron) resolution topography of a field (having a plurality of die—in this case, 30 die) extending in the X and Y directions on a substrate. The relatively systematic variations in the topography can be seen. Such a topography can be obtained using a high resolution optical measurement tool, such as an interferometry measurement apparatus. However, this process is destructive as it involves a special coating and it is performed without a patterning process stack (e.g., resist, anti-reflective coating, etc.). Thus, the lack of the patterning process stack and the presence of a different coating than in the normal patterning process make this measurement not representative of the topography in the patterning process. Thus, the typical tools to measure the topography tend to be slow, can be destructive of the substrate device pattern, and/or not be representative of the topography in the normal patterning process. Thus, such topography measurements are not particularly compatible for patterning process integration.

Figure 6:
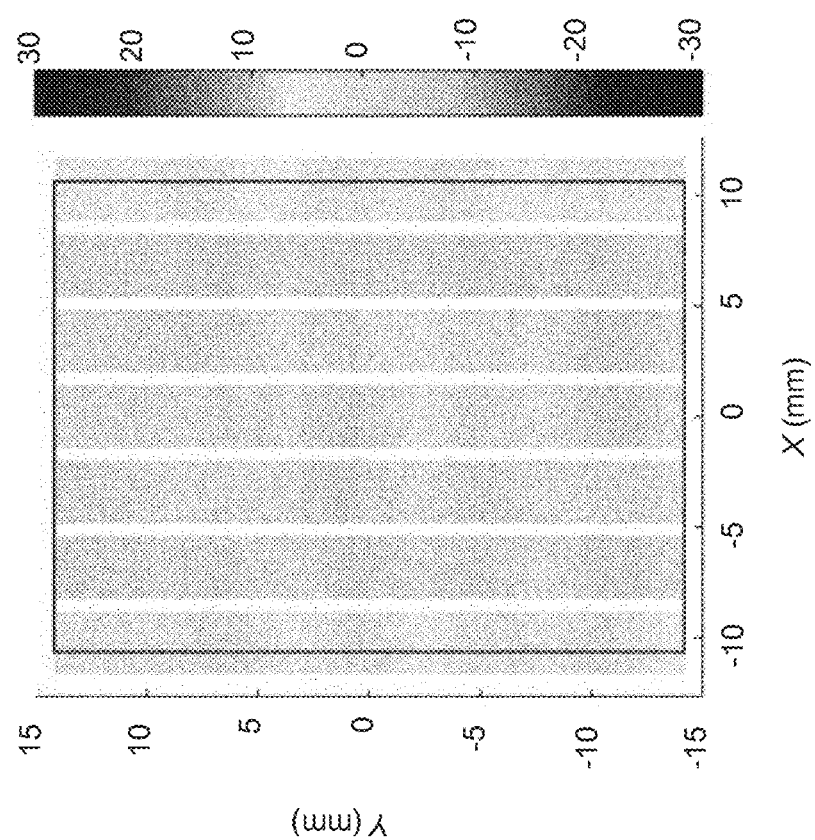
FIG. 6 illustrates a schematic estimated topography by a level sensor technique.

FIG. 6 shows a schematic example of an estimate of the topography of the same field as in FIG. 5 as measured by a level sensor, such as level sensor LS, using a convolution process with a pattern profile to enhance level sensor measurements. This technique involves estimating the topography by oversampling the measurement using pattern layout-aware deconvolutions. But, while a level sensor has good integration in the patterning process (it is fast, non-destructive and can measure the topography in the normal patterning process), this technique is a relatively coarse (and less accurate compared to FIG. 5) estimation, and it may not be able to reach better resolution due to the physical limit of relatively large level sensor spot footprint. Indeed, as seen in FIG. 6, the level sensor would not recognize much, if any, of the topography. Thus, a level sensor-based control system that manages focus control would not correct for much, if any, of the topography since its measurement results don't show much, if any, of the topography.

This micron-resolution topography can create significant issues in focus control, and process window centering. Thus, knowledge of the topography can be significant in pattern fidelity improvement of hotspots and other pattern features. Furthermore, patterning hotspot ranking, post-CMP hotspots identification also need this topography information.

Accordingly, it is desirable, for example, have an accurate, process integrable, high-resolution topography measurement technique.

Accordingly, there is provided herein a novel topography measurement technique. In an embodiment, this technique involves using a combination of data (e.g., CD data) corresponding to an unpatterned substrate and non-topographical measurement data (e.g., CD data) of a substrate with the topography to arrive at the topography. For example, in an embodiment, this technique involves using a combination of computational lithographic process modeling and a relatively high resolution (compared to, e.g., a level sensor), and relatively fast, critical dimension measurement to determine the topography. This technique can be readily integrated in the patterning process and its control systems. Thus, there is provided a process integrable, scalable, on-demand resolution topography measurement technique.

Figure 7:
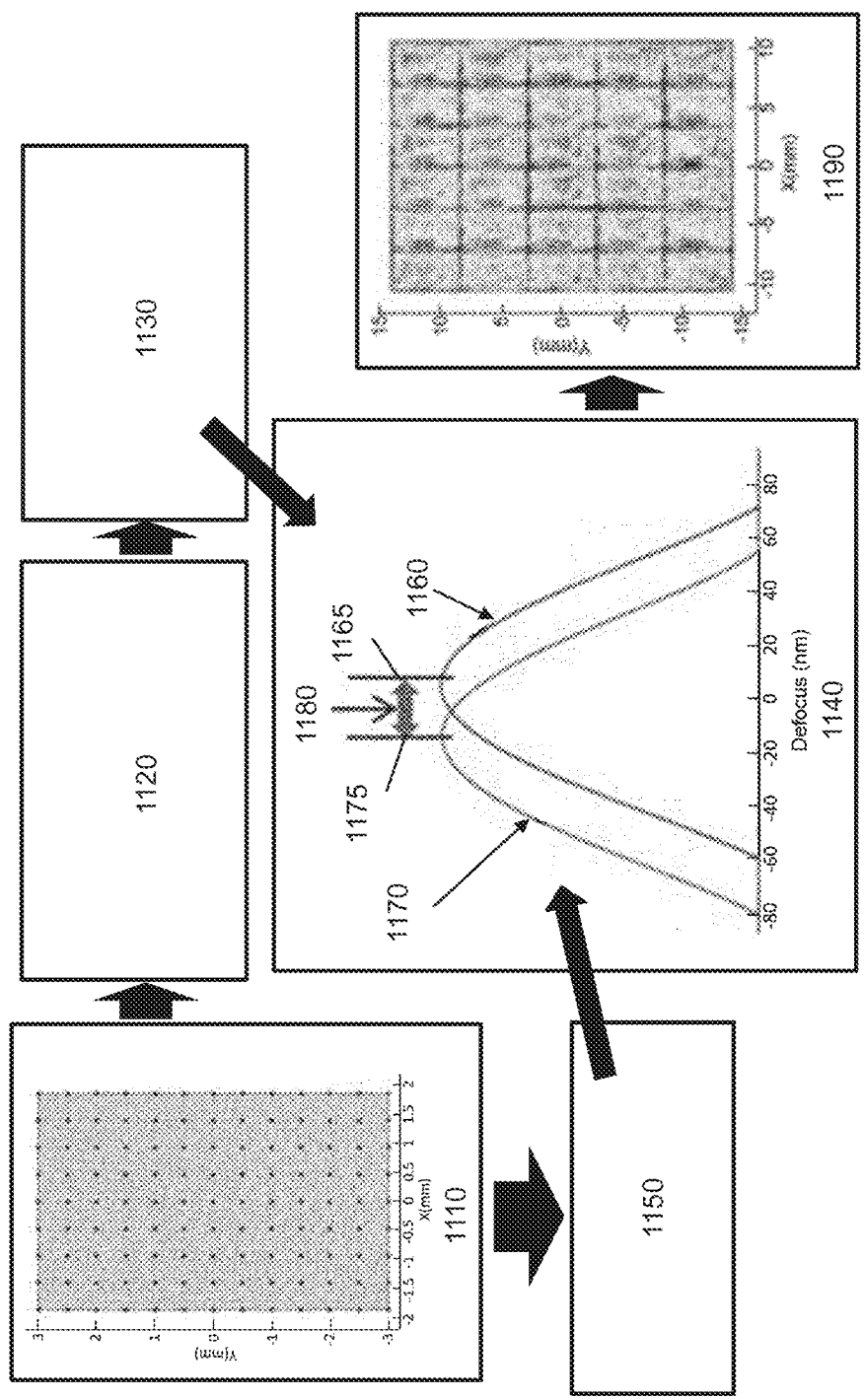
FIG. 7 illustrates an exemplary method of topography measurement.

An embodiment of the technique flow is depicted in FIG. 7. FIG. 7 shows a process of sub-micron resolution topography determination.

At 1110, the resolution of the topography determination is specified along with the locations on a substrate where the topography is determined. Thus, the graph at 1110 shows an example of the locations, as dots, where the topography is determined along with the resolution of the topography. In this case, a resolution of 0.5 mm is chosen as an example and shown by the spacing of the dots. Further, in this example, the locations and resolution are specified according to a particular die. The locations and resolution can be specified instead for a portion of a die, for a field comprising a plurality of dies, for a region of the substrate, etc.

The selection of the resolution and/or locations can be automatically chosen by the system (e.g. a hardware processor running software to implement at least part of the process) or manually controlled by a user. The selection of the resolution and/or locations can be dictated by, for example, process efficiency (e.g., the higher resolution, the more time to process), the capability of the measurement tool described hereafter, the need of the user, etc. Thus, the desired resolution can vary based on application needs. Additionally, the locations and their distribution can be chosen so as to achieve optimal inspection speed of the inspection apparatus (e.g., such that multiple locations are within a same field of view of the inspection apparatus). Optionally, the minimum resolution can be derived from a cut-off frequency (which relates to resolution) of a power spectral density of the pattern density map of the topography.

With the specification of the resolution and locations, the identified locations are processed through a computational route via 1160 and a measurement route via 1120 and 1130.

At 1120, a lithographic apparatus exposes a resist-layer on a substrate having the topography being evaluated with a pattern. In an embodiment, the pattern is a non-device test pattern or a device pattern.

Further, the pattern is exposed onto the substrate at a plurality of different focus conditions (e.g., a plurality of focus values around a best focus). Thus, referring to 1110, the die depicted there can be exposed at each of a plurality of focus conditions at, above and below the best focus condition. For example, the exposure can be a focus exposure matrix (FEM) which is typically used to identify a best dose and focus (or process window) based on CD measurements of selected locations of a die by analyzing, e.g., a Bossung plot. While the dose data from a FEM exposure is not required for this technique, the focus data at a particular dose can be used in this technique to arrive at the topography.

At 1130, a non-topographical parameter (e.g., CD) sensitive to focus for each location is measured and is measured for each focus condition. That is, the one or more features for which the non-topographical parameter is measured are ones whose non-topographical parameter varies in size with a change in size of focus. Desirably, features with high sensitivity (e.g., within 20% of the highest sensitivity) are selected. Computer simulation can be used to identify high focus sensitivity features.

Thus, a plurality of dies exposed at different focus conditions is measured. Further, the plurality of locations in each of those dies is measured. Thus, referring back to the die in 1110, there would be obtained a measurement of the non-topographical parameter (e.g., CD) for, for example, the top left location in the die for each of a plurality of focus conditions. Similarly, all the other locations in the die would have a collection of non-topographical parameter (e.g., CD) measurements at each of a plurality of focus conditions. Thus, each location would have a data set of values of the non-topographical parameter (e.g., CD) for a plurality of focus conditions. Such data sets can then be provided to a computation process at 1140 described in further detail hereafter. Or, a best focus can be determined for each location from those measurements (e.g., the center, average or peak of the distribution of that data, wherein the center, average or peak corresponds to the non-topographical parameter value closest to the expected value of the non-topographical parameter) and be provided as the data sets to 1140.

In an embodiment, a metrology tool for inspection of the non-topographical parameter (e.g., CD) has a resolution significantly higher than, e.g., a level sensor and can measure at, for example, 0.5 mm resolution. In an embodiment the metrology is an e-beam inspection tool. In an embodiment, the measurement is made after development of the resist. In an embodiment, the measurement is made after etch. In an embodiment, the measurement is non-destructive (e.g., the e-beam settings are so as not to be destructive).

In an embodiment, there may be one pattern type at a location to be measured or only one pattern type is measured at a location. Thus, each location would have one non-topographical parameter value. In an embodiment, there may be more than one pattern type at a location and so there may be a plurality of non-topographical parameter measurements for each location. Where more than one non-topographical parameter measurement is obtained for each location, then as further discussed hereafter, more than one topographical determination can be made for each location. Thus, there can be, for example, increased accuracy. But, for example, the measurement time may be increased.

At 1150, a computational lithography model is used to obtain data for use in comparison with the data at 1130. In an embodiment, the simulation model described above in respect of FIG. 3 can be used to take the pattern used for the exposure at 1120 and predict a best focus at or near each of the locations for each of the one or more pattern features of the pattern used for the exposure at 1120. That is, the model calculates on the basis that there is no topography and the substrate surface is perfectly flat. The predictions of the best focus for each location can then be output for use in comparison with the data at 1130 at 1140. In an embodiment, the data can comprise similar data as produced at 1130. For example, the simulation model described above in respect of FIG. 3 can be used to take the pattern used for the exposure at 1120 and determine predicted CD of the one or more pattern features at each of the locations for a range of focus conditions. Thus, the computational lithography model can produce a comparable output as the measurements at 1130, e.g., a collection of CD measurements at each location for a plurality of focus conditions.

Additionally or alternatively to predicting using a computational lithography model at 1150, an unpatterned substrate (i.e., a substrate without the topography being considered) covered with a resist layer can be exposed and measured similarly as in 1120 and 1130 to obtain a collection of CD measurements at each location for a plurality of focus conditions. That data can then be supplied to 1140 or a best focus can be determined for each location from those measurements and then supplied to 1140.

Then, at 1140, the data sets from 1130 and 1150 (each data set corresponding to a respective location) are processed to determine the topography at each of the locations. In an embodiment, a difference between a statistic or other representative information for each data set 1130, 1150 for a location provides a measure of the topography for the location. For example, where both data sets 1130, 1150 comprise a best focus value, then the difference between best focus values for a location represents a measure of the topography at the location. Where both data sets 1130, 1150 comprise values of the non-topographical parameter as a function of focus for a location, the center, average (e.g., mean) or peak of the distribution of the CD values as a function of focus can be determined for the data sets 1130, 1150. Then, a difference between those focus centers, averages or peaks (best focus) yields a measure of the topography at that location. Of course, the best focus of one of the data set 1130, 1150 can be compared against a determined focus center, average or peak for the other data set 1130, 1150.

Referring to 1140 in FIG. 7, there is depicted an example plot 1160 of the distribution of CD values (in the vertical axis) as a function of focus (in the horizontal axis, where 0 is a nominal focus and the other values are defocus from the nominal) for a particular location in the die of 1110 and based on the data from 1150 (e.g., the predicted data or the measured data from an unpatterned substrate). Further, there is depicted the focus center, average or peak (best focus) at 1165. Similarly, there is depicted in the same graph an example plot 1170 of the distribution of CD values as a function of focus for a particular location in the die of 1110 and based on the data from 1130 (e.g., the measured data from the substrate with the topography). Further, there is depicted the focus center, average or peak (best focus) at 1175. From this data, the topography at the location can be calculated as the difference between the center, average or peak 1175 and the center, average or peak 1165. In an embodiment, depending on where a nominal plane running through the topography is defined, the sign of the difference can indicate whether the topography is a protrusion or a depression relative to that plane. This analysis can then be repeated for each of the locations in 1140 to arrive at a topography of an area of the substrate as schematically depicted at 1190. Of course, the plots need not be created and are merely presented for visualization of the method. Also, the point 1165 and/or the point 1175 may represent the respective best focuses provided from 1150 or from 1130. Also, while the data may be discontinuous, data between data points can be obtained by interpolation, extrapolation, fitting, etc.

The topography measured in this technique can be supplemented with larger-range topography that the one or more lithographic apparatus metrology systems do resolve. For example, the topography measured in this technique can be changed in those parts for which the lithographic apparatus can produce relatively accurate topography data.

Moreover, the topography measured in this technique can be supplemented with topography data for a particular substrate that is obtained from the one or more lithographic apparatus metrology systems. Thus, a more customized topography can be produced for a particular substrate based on topography data from one or more lithographic apparatus metrology systems that measured the particular substrate. So, for example, in an embodiment, a "just-in-time" topography can be produced by combining the topography from this technique and modified with data from a level sensor of the lithographic apparatus measuring a particular substrate to obtain a specific topography for the substrate and for a particular location on the substrate.

The topography measured in this technique can be used to calibrate another topography determination technique. For example, the other technique could be a model that is generated from pattern perimeter density maps (i.e., the pattern density information of the structures in the current and all underlying layers), which model can provide an estimate of the topography. Thus, the topography measured with the technique described herein can provide a calibration of that model.

The determined topography using the technique described herein can be used as feedback or feedforward data for control of an apparatus (e.g., the lithography apparatus) in the patterning process so as to enable, e.g., layout/process-window aware control.

The determined topography using the technique described herein can be used for computational hotspot identification and/or improved ranking of the criticality of a hotspot; an embodiment of topography aware hotspot identification and ranking is described hereafter. Thus, this technique can be used in combination with a patterning hotspot detection and/or ranking method that is assisted by a product induced systematic topography.

The determined topography using the technique described herein can be used to identify a pattern geometry induced overlay issue. For example, a local micro-topography induced defocus can introduce a different sidewall angle in one layer than other. Then, an etch process could act differently with respect to this different sidewall angle in the one layer than the sidewall angle of the other layer, resulting in a CD shift from one layer to the other, and thus an overlay concern. So, knowing this micro-topography can help to control such overlay issues.

Thus, this technique provides a novel topography determination technique which involves using a combination of data (e.g., CD data) corresponding to an unpatterned substrate and non-topographical measurement data (e.g., CD data) of a substrate with the topography to arrive at the topography. In an embodiment, the technique involves a combination of computational lithography modeling and non-topographical parameter measurement to arrive at a topography. Further, this technique can be readily integrated into a patterning process and its control systems. And, in an embodiment, this technique is relatively fast and can be produce an accurate, relatively high-resolution topography determination without requiring non-destructive measurements.

As noted above, a computational lithography model can be used to identify and evaluate hotspots. For example, a user can provide pattern features suspected of failure and then the model can detect whether those pattern features are likely to be defective during, or after, the patterning process based on, e.g., process window analysis and consideration of patterning process variation. Similarly, the model can evaluate all or many of the features in a pattern layout and detect whether any pattern features are likely to be defective during, or after, the patterning process based on, e.g., process window analysis.

Thus, computational hotspot detection can identify pattern features that are process-window (depth of focus/exposure latitude) limiting and are potential defects (hotspots). But, computational hotspot detection can identify a large number (for example, millions per full chip) of hotspots. This presents a significant, if not impossible, challenge for high volume manufacturing monitoring of these hotspots and control with respect to them. Thus, typically, a smaller subset of hotspots (for example, in the hundreds or less) is identified as the most critical hotspots. This can typically involve ranking the hotspots so that the most critical hotspots are identified from the end of the ranking.

There are different methods available to assess the criticality of the hotspots and to rank them according to their degree of criticality. For example, based on a minimum overlapping process window, hotspots on a plurality of process window PW boundary points (boundary parameters such as leftmost of best focus, rightmost of best focus, highest exposure dose, and lowest exposure dose) are ranked.

While these methods rank the hotspots by considering aerial image properties of these hotspots, the methods can fail to identify one or more most critical hotspots in actuality on the substrate. This can happen, for example, when the substrate has a topography, e.g., a product induced topography that is typically systematic across the dies and the substrate. In that case, the overlapping process window (or available process window) is affected not only by the depth of focus and best focus differences per hotspot, but also the topography per hotspot.

Accordingly, there is desired, for example, a method to identify and/or rank the criticality of a hotspot feature on a product substrate where a topographical difference is present among the features.

So, there is provided a technique to identify and/or rank most or more critical hotspots based on the aerial image properties of the hotspot and the topography of the substrate where the pattern corresponding to the hotspot is created. In particular, there is disclosed is a method to include the modeled or measured intra-die or field topography for hotspot identification and/or ranking. Thus, in an embodiment, there is provided a patterning hotspot identification and/or ranking method that is assisted by a product induced systematic topography.

As noted above, a conventional hotspot identification and ranking methodology may not take account of the shift (e.g., systematic shift) of the focus distribution due to topography. Accordingly, there is provided method that factors topography into a hotspot identification and/or ranking.

Figure 8:
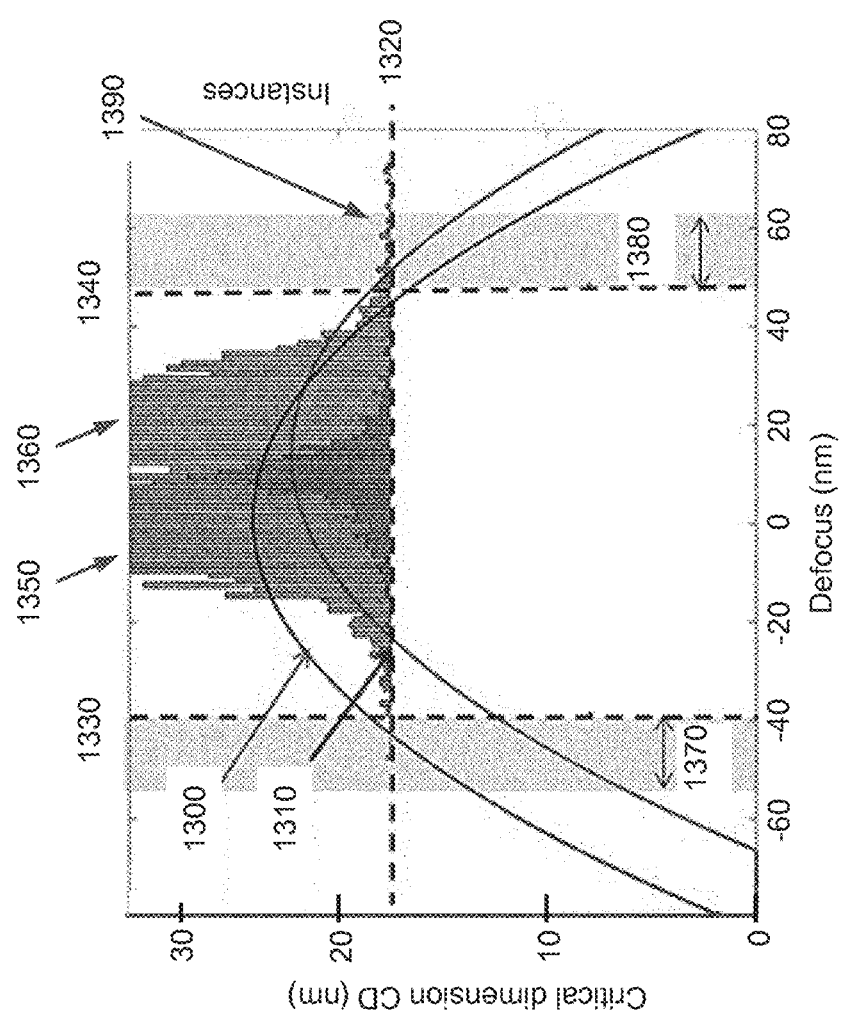
FIG. 8 illustrates Bossung plots of a first and second hotspots in combination with a focus distribution adjusted by topography data.

FIG. 8 shows example Bossung curves of two example pattern features (in this case hotspots), wherein the curves describe their critical dimension (in the vertical axis on the left side) as a function of defocus (on the horizontal axis). A first curve 1300 is for a first feature 1305 and the second curve 1310 is for a second, different feature 1315. There is further specified a CD threshold 1320, which defines a lower bound of acceptable CD for the first and second features. Of course, there need not be just one threshold, e.g., each pattern feature could have its own respective threshold. There is just one shown here for convenience.

There are also indicated two further thresholds that define outer bounds of the focus range for these features while being within the CD threshold. Thus, threshold 1330 specifies where the curve 1300 of the first feature crosses the threshold 1320 and the threshold 1340 specifies where the curve 1310 crosses the threshold 1320. Thus, the region between thresholds 1330 and 1340 and above threshold 1320 then generally provides a process window for detection of a hot spot. Any defocus outside of these outer bounds would yield a high likelihood of defect of both the first and second features.

Now, FIG. 8 further shows a focus distribution 1350 (in the form of a histogram) for the first feature 1305 across the substrate that is adjusted for the topography associated with the first feature and a focus distribution 1360 (in the form of a histogram) for the second feature 1315 across the substrate that is adjusted for topography of the second feature. As will be appreciated, there won't be uniform focus across the substrate. Thus, a focus distribution can be used that describes this variation of focus across the substrate. For example, a focus distribution can effectively provide a count of the number of occurrences of each of a plurality of focus values for the particular feature when exposed across the substrate. So, the particular focus distribution used can be, for example, one known from past performances of a patterning process under consideration, of different patterning process, etc. Further, it can be specific to a particular combination of apparatus and/or process steps. For example, it can be a normal (Gaussian) distribution.

Additionally or alternatively, an actual focus distribution (with a variation margin) obtained from the substrate can be used or be used to further tune the ranking. An actual focus distribution on the substrate may not necessarily be a Gaussian one, particularly if there is a systematic fingerprint that skews the distribution.

To obtain an actual focus distribution, for example, during the exposure processing of a particular feature, a level sensor can measure the height of the substrate in the region including the particular feature and thus give a focus value, i.e., whether it was at focus, at positive defocus, or negative defocus. But, the measurement resolution of a level sensor is significantly lower than the topography described above (e.g., hundreds of microns compared to micron or submicron topography). Moreover, while a level control system will adjust to put the substrate in focus as best as possible, it will be appreciated that not all of the region in the exposure field will typically be put at best focus—while some portions are at best focus, others will be at defocus.

So, these measurements can be obtained for a plurality of the regions (e.g., all the regions on the substrate) where the particular feature is exposed, including multiple regions within a die where the particular feature is repeated within a die. So, for example, if the feature occurs only once in a die and there are 100 die across the substrate, then 100 values of focus can be obtained for the particular feature and thus a distribution can be obtained as shown in FIG. 8. In an embodiment, the pattern features are measured in a same number of locations across the substrate so that there is no sampling bias.

So, the focus distribution gives a measure of the range of defocus that a particular feature will likely experience across the substrate due to various factors such as levelling errors, warping due to the substrate table, process-induced substrate deformation, etc.

In this case, the focus distributions 1350 and 1360 are approximately normal distributions. But, they don't need to be normal distributions. Significant are the extremes of the distributions as those are typically going to indicate the chances of failure as the patterning process will typically be designed to ensure the central portion of the distribution causes the feature to expose correctly and hopefully without defect.

Having these focus distributions, they are then adjusted by using the modeled or measured topography for the particular feature. In effect, the topography causes the distribution to shift left or right. Indeed, in an embodiment, the first feature 1305 is located lower (e.g., at a depression) than a plane running through (e.g., the middle) of the topography (e.g., more than 10 nm, and up to 15 nm, lower), while the second feature 1315 is located higher than the plane (e.g., at a protrusion) (e.g., more than 5 nm, and less than 10 nm, higher). Thus, the topography of the first feature 1305 cause its focus distribution to shift in one direction, while in this case, the topography of the second feature 1315 causes its focus distribution in the opposite direction. The result of the shifts of the respective first and second feature focus distributions by their respective topography is illustrated as focus distributions 1350 and 1360 in FIG. 8.

By evaluating FIG. 8 and without considering the focus distributions 1350 and 1360, it can be seen, that on the positive defocus side of the process window, the curve 1300 of the first feature 1305 falls below the CD threshold 1320 at a lower absolute value of defocus than the curve 1310 of the second feature 1315 and so the first feature 1305 is considered more limiting on the positive defocus side than the second feature 1315 (which will have a CD above the CD threshold at the defocus at which the first feature 1305 falls below the CD threshold). Thus, the first feature 1305 can be considered critical at the positive defocus side of the process window. Similarly, at the negative defocus side of the process window, the curve 1310 of the second feature 1315 falls below the CD threshold 1320 at a lower absolute value of defocus than the curve 1300 of the first feature 1305 and so the second feature 1315 is considered more limiting on the negative defocus side than the first feature 1305 (which will have a CD above the CD threshold at the defocus at which the second feature 1315 falls below the CD threshold). Thus, the second feature 1315 can be considered critical at the negative defocus side of the process window. The results are tabulated in Table 1 for convenience as follows:

TABLE 1

|  | Criticality at negative defocus side of the process window | Criticality at positive defocus side of the process window |
|---|---|---|
| First feature 1305 | Less critical | Critical |
| Second feature 1315 | Critical | Less critical |

So, in an embodiment, patterning process design, control, modification, etc. could proceed on the basis of this ranking for each of the first and second features 1305 and 1315. That is, both first and second features 1305 and 1315 could be highly ranked.

But, as noted above, there is provided, in an embodiment, an accounting for the topography in identifying whether a pattern feature is a critical hotspot and/or in ranking of pattern features in terms of their criticality as a hotspot. For example, a systematic topography difference between pattern features can cause a change in the identification and/or ranking of a critical hotspot compared to the identification and/or ranking discussed above.

Referring to FIG. 8, the identification and/or ranking of a critical hotspot can be accomplished in an embodiment by consideration of a topography of the substrate, e.g., using an adjusted focus distribution. For example, considering the positive defocus side, it can be seen that the focus distribution 1350 for the first feature 1305 is almost entirely within the process window for the curve 1300 (i.e., each of the focus distribution 1350 values at the positive defocus side would yield a CD value above the CD threshold 1320 on the curve 1300). But, in contrast, it can be seen that the focus distribution 1360 for the second feature 1315 is not entirely within the process window for the curve 1310. That is, there are a number of focus distribution 1360 values at the positive defocus side that would yield a CD value below the CD threshold 1320 on the curve 1310. These are generally denoted at region 1390. Thus, the second feature 1315 should be considered critical at the positive defocus side. But recall earlier, the second feature 1315 was considered less critical at the positive defocus side. Thus, in view of this analysis, the second feature 1315 can be identified as critical at the positive defocus side and/or its ranking can be accordingly adjusted. Similarly, the first feature 1305 can be identified as less critical at the positive defocus side and/or its ranking can be accordingly adjusted.

So, taking the topography into account, the second feature 1315 is more likely to be defective (positive defocus defect) since the focus distribution (e.g., across the full substrate) at the second feature 1315 location on the substrate overlaps the process window boundary sufficiently. Hence, the second feature 1315 can be considered more critical when topography data is considered.

Considering the negative defocus side, it can be seen that the focus distribution 1350 for the first feature 1305 is almost entirely within the process window for the curve 1300 (i.e., each of the focus distribution 1350 values at the negative defocus side would yield a CD value above the CD threshold 1320 on the curve 1300). Similarly, it can be seen that the focus distribution 1360 for the second feature 1315 is almost entirely within the process window for the curve 1310 (i.e., each of the focus distribution 1360 values at the negative defocus side would yield a CD value above the CD threshold 1320 on the curve 1310). Thus, in this case, the first and second features 1305 and 1310 could be considered relatively equally critical or neutral. But recall earlier, the first feature 1305 was considered less critical while the second feature 1315 was considered critical at the negative defocus side. Thus, the second feature 1315 can be identified as equally critical or neutral at the negative defocus side and/or its ranking can be accordingly adjusted. Similarly, the first feature 1305 can be identified as equally critical or neutral at the negative defocus side and/or its ranking can be accordingly adjusted.

The results of this analysis are tabulated in Table 2 for convenience as follows:

TABLE 2

|  | Criticality at negative defocus side of the process window | Criticality at negative defocus side of the process window |
|---|---|---|
| First feature 1305 | Equally critical | Less critical |
| Second feature 1315 | Equally Critical | Critical |

Interestingly, even though a first feature 1305 can be relatively lower to a plane running through the topography than a second feature 1315 is higher to the plane, the second feature 1315 can be identified and/or ranked as critical or more critical.

Appropriate thresholds or functions can be applied to determine the extent of the overlap between the focus distribution and the process windows. For example, there can be a limit that at least 0.5%, 1%, 2%, or 5% of the focus distribution must exceed the applicable process window to cause identification and/or ranking change of the criticality of a hotspot. In an embodiment, there can be a relative consideration of overlap or non-overlap, e.g., a proportion of overlap (or non-overlap) of the focus distribution of the first feature relative to its process window to the proportion of overlap (or non-overlap) of the focus distribution of the second feature relative to its process window. For example, the relative amount (between features) of occurrences outside the respective process windows can be evaluated.

As shown in FIG. 8, there can be a search range for determining whether a pattern feature should be identified as a critical or less critical hotspot and/or should be adjusted in hotspot ranking. For example, the search range 1370 can be used to evaluate for such identification and/or ranking adjustment on the negative defocus side. Since the second feature 1315 would be considered critical on the negative defocus side absent consideration of topography, its criticality and/or ranking would at least be adjusted if there is focus distribution of the first feature 1305 in the search range 1370. Similarly, the search range 1380 can be used to evaluate for such identification and/or ranking adjustment on the positive defocus side. Since the first feature 1305 would be considered critical on the positive defocus side absent consideration of topography, its criticality and/or ranking would at least be adjusted if there is focus distribution of the second feature 1315 in the search range 1380.

While the topography data was described as being added/subtracted from the focus distribution data, it can be added/subtracted from the simulated process window curve data. And, while the discussion has described an analysis in relation to curves and graphs, the techniques described can be performed merely with respect to the data without having to generate curves, graphs, etc.

Figure 9:
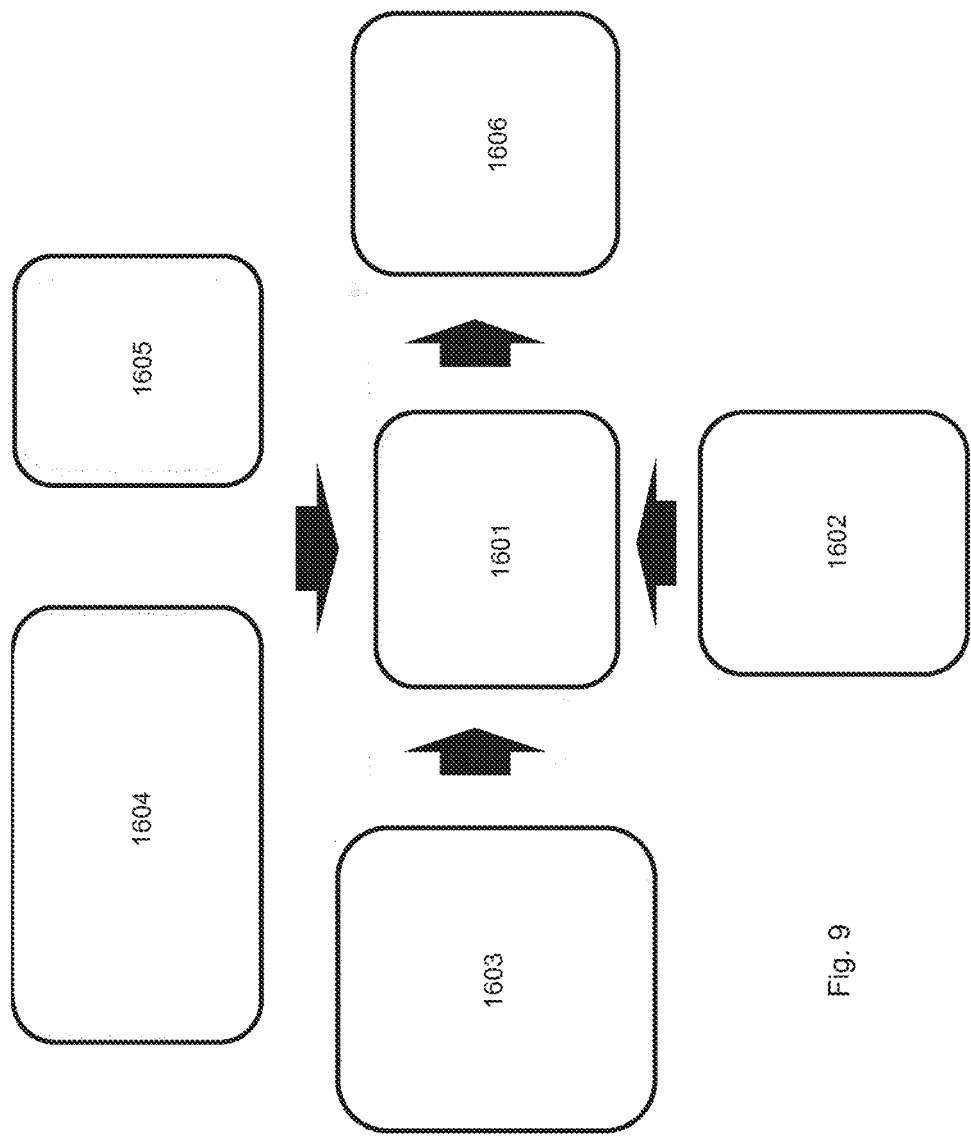
FIG. 9 illustrates an exemplary scheme to include topography for the identification and/or ranking of the criticality of hotspots.

FIG. 9 illustrates an exemplary scheme to include topography in hotspot identification or ranking. At 1601, the process identifies and/or ranks hotspots as described above based on topography data. The process of 1601 obtains information regarding a focus distribution at 1602. At 1602, the focus distribution can be measured as described above or it can be a certain nominal (e.g., Gaussian) distribution. The distributions can be like focus distributions 1350 and 1360. The process of 1601 further obtains process window results for a plurality of pattern features (hotspots) from a computation modelling of the patterning process. At 1601, a simulation can be performed to obtain results like curves 1300 and 1310. The process of 1601 obtains information regarding a topography associated with the pattern features under consideration at 1604 and/or 1605. At 1604, the topography information can be a modeled topography, which can be obtained by performing calculations using the model to derive the topography for at least the pattern features under consideration. At 1605, the topography information can be a measured topography for at least the pattern features under consideration, which can be obtained by a measurement using an interferometer, a SEM, or the modelling-assisted measurement technique described above in respect of FIGS. 5-7. The process 1601 then results, based on the process described in relation to FIG. 8, in an identification and/or ranking (e.g., re-ranking) of the criticality of hotspots. These identified/ranked hotspots are then more reflective of the patterning process and can enable more accurate hotspot criticality determination, which then lead to better patterning process design, control, modification, etc. and thus better patterning process results.

Thus, in an embodiment, modeled or measured intra-die or field topography is used in critical hotspot identification or ranking based, which can lead to better identification and/or ranking results than conventional techniques. For example, the present techniques can provide a way to include the effect of planarization (e.g. chemical-mechanical polishing) on hotspots. Thus, topography assisted hotspot identification/ranking can more accurately identify a more or most limiting hotspot, thus potentially reducing verification/monitoring metrology time.

In an embodiment, there is provided a method of topography determination, the method comprising: obtaining a first focus value derived from a computational lithography model modeling patterning of an unpatterned substrate or derived from measurements of a patterned layer on an unpatterned substrate; obtaining a second focus value derived from measurement of a substrate having a topography; and determining a value of the topography from the first and second focus values.

In an embodiment, the determining comprises a difference between the first and second focus values. In an embodiment, the first and second values correspond to a best focus value. In an embodiment, obtaining the second value comprises performing a measurement of a non-topographical parameter for each of a plurality of focus values. In an embodiment, the non-topographical parameter comprises critical dimension. In an embodiment, the second focus value is derived from measurement by an electron beam inspection apparatus of the substrate having the topography. In an embodiment, the first focus value is derived from a computational lithography model modeling patterning of an unpatterned substrate. In an embodiment, the first focus value is derived from measurements of a patterned layer on an unpatterned substrate. In an embodiment, all the recesses and protrusions of the topography are in the sub-micron scale. In an embodiment, the first focus value, the second focus value and the determined value of the topography are obtained at a plurality of locations across the substrate and the plurality of values of the topography are combined to form a map of the topography. In an embodiment, the method further comprises selecting, by a user, a resolution of the locations and/or the positional arrangement of the locations, on the substrate.

In an embodiment, there is provided a method of hotspot evaluation, the method comprising: obtaining process window data for each of a first hotpot and a second hotspot, the process window data comprising focus information for each of the first and second hotspot; and evaluating, by a hardware computer, the focus information of the process window data based on topography data of a substrate, to identify or change a criticality of the first and/or second hotspot.

In an embodiment, the evaluating comprises evaluating the focus information against a focus distribution across a substrate and wherein the focus distribution or the focus information is offset using the topography data. In an embodiment, the focus distribution is obtained from measurements of a plurality of fields or die located across a substrate. In an embodiment, the evaluating comprises a relative consideration between the overlap or non-overlap of the focus distribution with the focus information of the first hotspot and the overlap or non-overlap of the focus distribution with the focus information of the second hotspot. In an embodiment, the evaluating comprising adjusting a ranking of the criticality of the first hotspot relative to that of the second hotspot. In an embodiment, the process window data is obtained by computation lithography modelling. In an embodiment, the focus information at a negative defocus extremity or a positive defocus extremity of the process window data is evaluated to identify or change a criticality of the first and/or second hotspot. In an embodiment, the topography is of a sub-micron or nanometer scale.

As will be appreciated by one of ordinary skill in the art, the present application may be embodied as a system, method, or computer program product. Accordingly, aspects of the present application may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present application may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable medium would include the following: an electrical connection having one or more wires, a portable computer diskette, a hard disk, a random access memory (RAM), a read-only memory (ROM), an erasable programmable read-only memory (e.g. EPROM or Flash memory), an optical fiber, a portable compact disc read-only memory CDROM, an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in a baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer code embodied on a computer readable medium may be transmitted using any appropriate medium, including but not limited to wireless, wireline, optical fiber cable, radio frequency RF, etc., or any suitable combination thereof.

Computer program code for carrying out operations for aspects of the present application may be written in any combination of one or more programming languages, including an object oriented programming language such as Java™, Smalltalk™, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network LAN or a wide area network WAN, or the connection may be made to an external computer (for example, through the Internet using an Internet Service Provider).

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments may be implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present application has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

Figure 10:
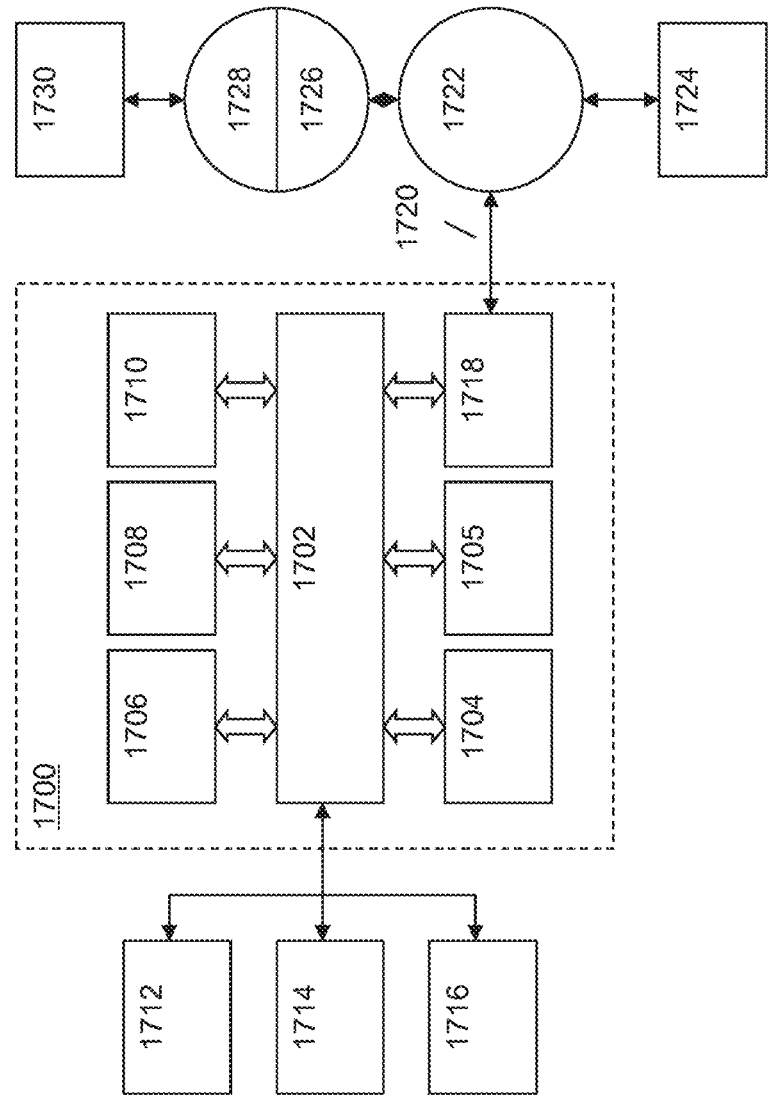
FIG. 10 illustrates a block diagram that illustrates an embodiment of a computer system which can assist in implementing any of the methods and flows disclosed herein.

FIG. 10 shows a block diagram that illustrates an embodiment of a computer system 1700 which can assist in implementing any of the methods and flows disclosed herein. Computer system 1700 includes a bus 1702 or other communication mechanism for communicating information, and a processor 1704 (or multiple processors 1704 and 1705) coupled with bus 1702 for processing information. Computer system 1700 also includes a main memory 1706, such as a random access memory RAM or other dynamic storage device, coupled to bus 1702 for storing information and instructions to be executed by processor 1704. Main memory 1806 also may be used for storing temporary variables or other intermediate information during execution of instructions to be executed by processor 1704. Computer system 1700 further includes a read only memory ROM 1708 or other static storage device coupled to bus 1702 for storing static information and instructions for processor 1704. A storage device 1710, such as a magnetic disk or optical disk, is provided and coupled to bus 1702 for storing information and instructions.

Computer system 1700 may be coupled via bus 1702 to a display 1712, such as a cathode ray tube (CRT) or flat panel or touch panel display for displaying information to a computer user. An input device 1714, including alphanumeric and other keys, is coupled to bus 1702 for communicating information and command selections to processor 1704. Another type of user input device is cursor control 1716, such as a mouse, a trackball, or cursor direction keys for communicating direction information and command selections to processor 1704 and for controlling cursor movement on display 1712. This input device typically has two degrees of freedom in two axes, a first axis (e.g. x) and a second axis (e.g. y), that allows the device to specify positions in a plane. A touch panel (screen) display may also be used as an input device.

According to one embodiment, portions of a process described herein may be performed by computer system 1700 in response to processor 1704 executing one or more sequences of one or more instructions contained in main memory 1706. Such instructions may be read into main memory 1706 from another computer-readable medium, such as storage device 1710. Execution of the sequences of instructions contained in main memory 1706 causes processor 1704 to perform the process steps described herein. One or more processors in a multi-processing arrangement may also be employed to execute the sequences of instructions contained in main memory 1706. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 1704 for execution. Such a medium may take many forms, including but not limited to, non-volatile media, volatile media, and transmission media. Non-volatile media include, for example, optical or magnetic disks, such as storage device 1710. Volatile media include dynamic memory, such as main memory 1706. Transmission media include coaxial cables, copper wire and fiber optics, including the wires that comprise bus 1702. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 1704 for execution. For example, the instructions may initially be borne on a magnetic disk of a remote computer. The remote computer can load the instructions into its dynamic memory and send the instructions over a telephone line using a modem. A modem local to computer system 1700 can receive the data on the telephone line and use an infrared transmitter to convert the data to an infrared signal. An infrared detector coupled to bus 1702 can receive the data carried in the infrared signal and place the data on bus 1702. Bus 1702 carries the data to main memory 1706, from which processor 1704 retrieves and executes the instructions. The instructions received by main memory 1706 may optionally be stored on storage device 1710 either before or after execution by processor 1704.

Computer system 1700 may also include a communication interface 1718 coupled to bus 1702. Communication interface 1718 provides a two-way data communication coupling to a network link 1720 that is connected to a local network 1722. For example, communication interface 1718 may be an integrated services digital network ISDN card or a modem to provide a data communication connection to a corresponding type of telephone line. As another example, communication interface 1718 may be a local area network LAN card to provide a data communication connection to a compatible LAN. Wireless links may also be implemented. In any such implementation, communication interface 1718 sends and receives electrical, electromagnetic or optical signals that carry digital data streams representing various types of information.

Network link 1720 typically provides data communication through one or more networks to other data devices. For example, network link 1720 may provide a connection through local network 1722 to a host computer 1724 or to data equipment operated by an Internet Service Provider ISP 1726. ISP 1726 in turn provides data communication services through the worldwide packet data communication network, now commonly referred to as the "Internet" 1728. Local network 1722 and Internet 1728 both use electrical, electromagnetic or optical signals that carry digital data streams. The signals through the various networks and the signals on network link 1720 and through communication interface 1718, which carry the digital data to and from computer system 1700, are exemplary forms of carrier waves transporting the information.

Computer system 1700 can send messages and receive data, including program code, through the network(s), network link 1720, and communication interface 1718. In the Internet example, a server 1730 might transmit a requested code for an application program through Internet 1728, ISP 1726, local network 1722 and communication interface 1718. One such downloaded application may provide for a method or portion thereof as described herein, for example. The received code may be executed by processor 1704 as it is received, and/or stored in storage device 1710, or other non-volatile storage for later execution. In this manner, computer system 1700 may obtain application code in the form of a carrier wave.

The embodiments may further be described using the following clauses:

1. A method of topography determination, the method comprising:
   obtaining a first focus value derived from a computational lithography model modeling patterning of an unpatterned substrate or derived from measurements of a patterned layer on an unpatterned substrate;
   obtaining a second focus value derived from measurement of a substrate having a topography; and
   determining a value of the topography from the first and second focus values.
2. The method of clause 1, wherein the determining comprises a difference between the first and second focus values.
3. The method of clause 2, wherein the first and second values correspond to a best focus value.
4. The method of any of clauses 1 to 3, wherein obtaining the second value comprises performing a measurement of a non-topographical parameter for each of a plurality of focus values.
5. The method of clause 4, wherein the non-topographical parameter comprises critical dimension.
6. The method of any of clauses 1 to 5, wherein the second focus value is derived from measurement by an electron beam inspection apparatus of the substrate having the topography.
7. The method of any of clauses 1 to 6, wherein the first focus value is derived from a computational lithography model modeling patterning of an unpatterned substrate.
8. The method of any of clauses 1 to 6, wherein the first focus value is derived from measurements of a patterned layer on an unpatterned substrate.

9. The method of any of clauses 1 to 8, wherein all the recesses and protrusions of the topography are in the sub-micron scale.

10. The method of any of clauses 1 to 9, wherein the first focus value, the second focus value and the determined value of the topography are obtained at a plurality of locations across the substrate and the plurality of values of the topography are combined to form a map of the topography.

11. The method of clause 10, further comprising selecting, by a user, a resolution of the locations and/or the positional arrangement of the locations, on the substrate.

12. A method of hotspot evaluation, the method comprising:
obtaining process window data for each of a first hotpot and a second hotspot, the process window data comprising focus information for each of the first and second hotspot; and
evaluating, by a hardware computer, the focus information of the process window data based on topography data of a substrate, to identify or change a criticality of the first and/or second hotspot.

13. The method of clause 12, wherein the evaluating comprises evaluating the focus information against a focus distribution across a substrate and wherein the focus distribution or the focus information is offset using the topography data.

14. The method of clause 13, wherein the focus distribution is obtained from measurements of a plurality of fields or die located across a substrate.

15. The method of clause 13 or clause 14, wherein the evaluating comprises a relative consideration between the overlap or non-overlap of the focus distribution with the focus information of the first hotspot and the overlap or non-overlap of the focus distribution with the focus information of the second hotspot.

16. The method of any of clauses 12 to 15, wherein the evaluating comprising adjusting a ranking of the criticality of the first hotspot relative to that of the second hotspot.

17. The method of any of clauses 12 to 16, wherein the process window data is obtained by computation lithography modelling.

18. The method of any of clauses 12 to 17, wherein the focus information at a negative defocus extremity or a positive defocus extremity of the process window data is evaluated to identify or change a criticality of the first and/or second hotspot.

19. The method of any of clauses 12 to 19, wherein the topography is of a sub-micron or nanometer scale.

20. A computer program product comprising a computer non-transitory readable medium having instructions recorded thereon, the instructions when executed by a computer implementing the method of any of clauses 1 to 19.

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid crystal display panels, thin film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The terms "optimizing" and "optimization" as used herein refers to or means adjusting a patterning apparatus (e.g., a lithography apparatus), a patterning process, etc. such that results and/or processes have more desirable characteristics, such as higher accuracy of projection of a design pattern on a substrate, a larger process window, etc. Thus, the term "optimizing" and "optimization" as used herein refers to or means a process that identifies one or more values for one or more parameters that provide an improvement, e.g. a local optimum, in at least one relevant metric, compared to an initial set of one or more values for those one or more parameters. "Optimum" and other related terms should be construed accordingly. In an embodiment, optimization steps can be applied iteratively to provide further improvements in one or more metrics.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The descriptions above are intended to be illustrative, not limiting. Thus, it will be apparent to one skilled in the art that modifications may be made as described without departing from the scope of the claims set out below.

The invention claimed is:

1. A computer program product comprising a non-transitory computer-readable medium having instructions therein, the instructions, upon execution by a computer system, configured to cause the computer system to at least:
obtain a first value of, or pertaining to, focus, the first value derived from a computational lithography model modeling patterning of an unpatterned substrate or derived from measurements of a patterned layer on an unpatterned substrate;
obtain a second value of, or pertaining to, focus, the second value derived from a result of a measurement of a substrate having a topography; and
determine a value of the topography from the first and second values.

2. The computer program product of claim 1, wherein the second value is derived from measurement by an electron beam inspection apparatus of the substrate having the topography.

3. The computer program product of claim 1, wherein the instructions are further configured to cause the computer system to select a plurality of locations across the substrate for measurement by a metrology or inspection apparatus to optimize inspection or measuring speed of the metrology or inspection apparatus.

4. The computer program product of claim 1, wherein the instructions are further configured to cause the computer system to identify, based on the value of the topography, an overlay error.

5. The computer program product of claim 1, wherein the instructions are further configured to cause the computer system to feed forward or feedback the value of the topography to an apparatus for control or configuration of a patterning process of providing a pattern on a substrate using the apparatus.

6. The computer program product of claim 1, wherein the first value, the second value and the determined value of the topography are obtained at a plurality of locations across the substrate and the plurality of values of the topography are combined to form a map of the topography.

7. The computer program product of claim 1, wherein the determination of the value of the topography involves a difference between the first and second values.

8. The computer program product of claim 1, wherein the obtaining of the second value comprises performance of a measurement of a non-topographical parameter for each of a plurality of focus values.

9. The computer program product of claim 1, wherein the first value is a value of focus and/or the second value is a value of focus.

10. A computer program product comprising a non-transitory computer-readable medium having instructions therein, the instructions, upon execution by a computer system, configured to cause the computer system to at least:
   obtain a first value of a parameter sensitive to focus, the first value derived from modelling using a computational lithography model or from measurements of a patterned layer on an unpatterned substrate;
   obtain a second value of a parameter sensitive to focus, the second value derived from measurement of a substrate having a topography; and
   determine a value of the topography from the first and second values.

11. The computer program product of claim 10, wherein the second value is derived from measurement by an electron beam inspection apparatus of the substrate having the topography.

12. The computer program product of claim 10, wherein the instructions are further configured to cause the computer system to select a plurality of locations across the substrate for measurement by a metrology or inspection apparatus to optimize inspection or measuring speed of the metrology or inspection apparatus.

13. The computer program product of claim 10, wherein the instructions are further configured to cause the computer system to identify, based on the value of the topography, an overlay error.

14. The computer program product of claim 10, wherein the instructions are further configured to cause the computer system to feed forward or feedback the value of the topography to an apparatus for control or configuration of a patterning process of providing a pattern on a substrate using the apparatus.

15. The computer program product of claim 10, wherein the first value, the second value and the determined value of the topography are obtained at a plurality of locations across the substrate and the plurality of values of the topography are combined to form a map of the topography.

16. The computer program product of claim 10, wherein the determination of the value of the topography involves a difference between the first and second values.

17. The computer program product of claim 10, wherein the obtaining of the second value comprises performance of a measurement of a non-topographical parameter for each of a plurality of focus values.

18. A method of topography determination, the method comprising:
   obtain a first value of, or pertaining to, focus, the first value derived from a computational lithography model modeling patterning of an unpatterned substrate or derived from measurements of a patterned layer on an unpatterned substrate;
   obtain a second value of, or pertaining to, focus, the second value derived from a result of a measurement of a substrate having a topography; and
   determining, by a hardware computer, a value of the topography from the first and second values.

19. The method of claim 18, wherein the first value is a value of focus and/or the second value is a value of focus.

20. The method of claim 18, wherein the first value is a value of a parameter sensitive to focus and/or the second value is a value of a parameter sensitive to focus.

* * * * *